United States Patent [19]

Ishii

[11] Patent Number: 5,463,235
[45] Date of Patent: Oct. 31, 1995

[54] SEMICONDUCTOR MEMORY COMPRISING A MEMORY CELL WITHOUT A TRANSISTOR

[75] Inventor: Tatsuya Ishii, Itami, Japan

[73] Assignee: Mitsubishi Denki Kabushiki Kaisha, Tokyo, Japan

[21] Appl. No.: 279,598

[22] Filed: Jul. 25, 1994

[30] Foreign Application Priority Data

Jul. 26, 1993 [JP] Japan .................... 5-183700

[51] Int. Cl.⁶ .................... H01L 29/68; H01L 29/78; H01L 29/92; H01L 27/02
[52] U.S. Cl. .................... 257/300; 257/306; 257/311; 257/317; 257/318; 257/319; 257/320; 257/321; 257/535
[58] Field of Search .................... 257/300, 306, 257/311, 317, 318, 319, 320, 321, 535; 365/180, 184, 185

[56] References Cited

U.S. PATENT DOCUMENTS 4,375,085  2/1983  Grisc et al. .................... 257/300
4,914,546  4/1990  Altar .................... 257/311
5,300,799  4/1994  Nakamura et al. .................... 257/300

OTHER PUBLICATIONS

Sakao et al, "A Capacitor-Over-Bit-Line (COB) Cell with a Hemispherical-Grain Storage Node for 64Mb DRAMs", IEEE—IEDM 90-655 pp. 27.3.1-27.3.4.

Primary Examiner—Ngân V. Ngô
Attorney, Agent, or Firm—Leydig, Voit & Mayer

[57] ABSTRACT

A semiconductor memory includes a laminated structure including a first word line in a p-type silicon substrate, a first silicon oxide film on the word line, a bit line, a tunnel oxide film, a storage node of polycrystalline silicon containing impurities, a second silicon oxide film, and a second word line of polycrystalline silicon, wherein the dielectric constant or area of the tunnel oxide film is smaller than the dielectric constant or area of the first silicon oxide film and smaller than the dielectric constant or the area of the second silicon oxide film. With this arrangement, the memory cell structure can be extremely simple. It is possible to reduce the number of production steps and, therefore, it is also possible to improve production yield. The present invention provides a high-density, high-performance, and low cost semiconductor memory.

4 Claims, 11 Drawing Sheets

FIG.6A
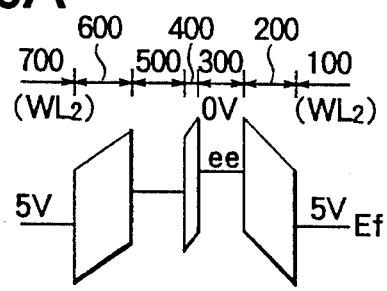
FIG.6B
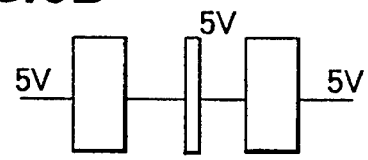
FIG.6C
FIG.6E
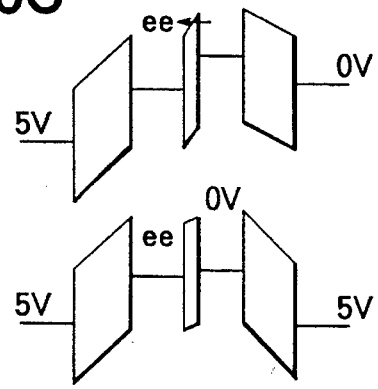
FIG.6D
FIG.6F
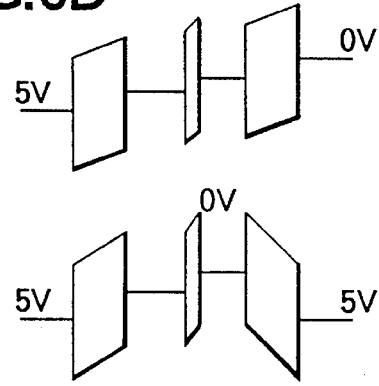
FIG.6G
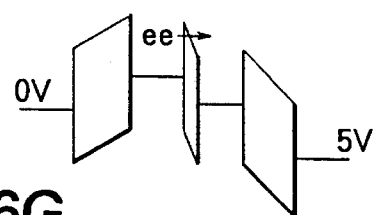
FIG.6H
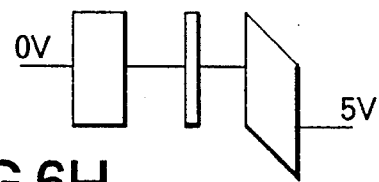
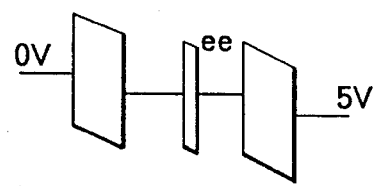
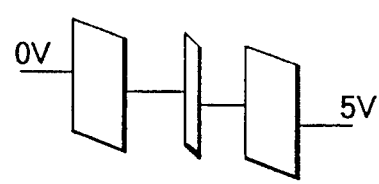
FIG.6I
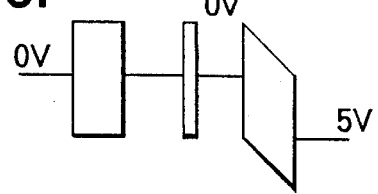
FIG.6J
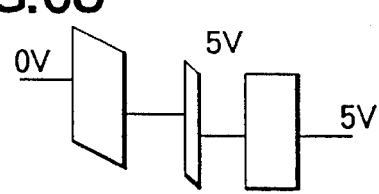

SEMICONDUCTOR MEMORY COMPRISING A MEMORY CELL WITHOUT A TRANSISTOR

BACKGROUND OF THE INVENTION

1. Field of the Invention

The present invention relates to a semiconductor memory and a production method thereof, and, more specifically, to a dynamic random access memory (DRAM) and a production method thereof.

2. Description of the Related Art

In recent years, information possessing systems including a computer have become very popular, which brings about a great expansion of the market for semiconductor memories. The market is still expanding at a great rate. In this application field, the semiconductor memory is required to have a great memory capacity, and to operate at a high speed. In view of the above, research and development are being continued to achieve a semiconductor memory having a greater memory capacity, higher operation speed, and higher reliability.

There are various types of semiconductor memories. Among them, there is a DRAM which is a semiconductor memory capable of reading and writing information in a random fashion. A DRAM comprises a memory cell array for storing a large amount of information, and a peripheral circuit for selecting a memory cell, which is a unit memory circuit, and for controlling the input/output operation between the memory and an external system.

FIG. 15 is a block diagram illustrating a configuration of a common DRAM. As shown in the figure, DRAM 50 comprises: a memory cell array 51 for storing information to be stored; a row and column address buffer 52 that receives an address signal from the outside wherein the address signal specifies a memory cell to be selected; a row decoder 53 that extracts a row address of a memory cell to be selected from the address signal; a column decoder 54 that extracts a column address of a memory cell to be selected from the address signal; a sense refresh amplifier 55 for amplifying a signal in reading information from a memory cell; a data-in buffer 56 for receiving an information signal from outside; a data-out buffer 57 for outputting a stored information signal; and a clock generator 58 for generating a basic control signal.

The memory cell array 51 occupies a large area on a semiconductor chip. In the memory cell array 51, a plurality of memory cells each storing unit information are arranged in a matrix fashion.

FIG. 16 illustrates an equivalent circuit of four memory cells wherein each memory cell is capable of storing one-bit information. As shown in the figure, the memory cell array 51 includes a plurality of word lines WL extending in the X-row direction, and a plurality of pairs of bit-lines (BL, $\overline{BL}$) extending in the Y-column direction. Memory cells M are formed in the vicinities of word and bit lines. Each memory cell M comprises a capacitor for storing information charge, and an insulated gate field effect transistor or a MIS (Metal Insulator Semiconductor) transistor. This type of memory cell has a simple configuration, and thus is used very broadly. In FIG. 16, a pair of bit lines (BL, $\overline{BL}$) are disposed parallel to each other toward a sense refresh amplifier 55 in a folded bit line scheme.

A conventional semiconductor memory is configured in such a manner described above, and operates as follows.

In FIG. 15, data are stored in the N (n×m) bit memory cell array 51. Address information specifying a memory cell where information is to be read or written is stored in the row and column address buffer 52. The row decoder 59 selects a word line (from n word lines) thereby electrically connecting m bit memory cells to the sense refresh amplifier 55 through bit lines. On the other hand, the column decoder 54 selects a pair of bit lines (from m pairs of bit lines) thereby connecting a sense refresh amplifier 55 to a data-in buffer 56 or a data-out buffer 57. As described above, one memory cell is chosen from the N bit memory cell array 51 according to the address signal.

Furthermore, as shown in FIG. 16, the gate electrode of each MIS transistor is connected to a word line (WL). One of the source/drain electrodes of each MIS transistor is connected to an electrode of a capacitor C, and the other electrode is connected to either bit line of a pair of bit lines, that is, either BL or $\overline{BL}$. When a word line WL is selected according to a specified address and thus a predetermined voltage is applied to the word line WL, a MIS transistor is turned on and charge corresponding to the voltage on a bit line BL or $\overline{BL}$ flows into a capacitor C and is stored in it. To read data, a predetermined voltage is applied to a selected word line WL thereby turning on a MIS transistor. Then, the charge stored in a capacitor C is discharged through a bit line BL or $\overline{BL}$.

FIG. 17A illustrates an example of memory cell structure of a conventional DRAM disclosed in "A CAPACITOR-OVER-BIT-LINE (COB) CELL WITH A HEMISPHERICAL-GRAIN STORAGE NODE FOR 64Mb DRAMs" (M. Sakao et al., IEEE IEDM Technical Digest pp.655–658, 1990). In this memory cell M, MIS transistors are disposed in a flat area of the primary surface of a semiconductor substrate, and capacitors are formed in a stacked fashion.

In such a memory cell, two memory cells are disposed in a region surrounded by an isolation oxide film 10 on the primary surface of the p-type semiconductor substrate 1 in such a manner that both memory cells share one bit line contact 8. Gate electrodes 15c of n-channel MIS transistors are disposed from side to side via the bit line contact 8. Each n-channel MIS transistor comprises a gate electrode 15c disposed on the p-channel silicon substrate 1 via a thin gate dielectric film 17, and further comprises n-type source/drain impurity diffusion layers 18 disposed at each side of the gate electrode 15c. One of n-type source/drain impurity diffusion layers 18 is connected to bit line 6, and the other n-type source/drain impurity diffusion layer 18 is connected to a storage node (an information charge storage layer) 7 that forms a capacitor.

The gate electrode 15c of the MIS transistor also serves as a first word line extending from the gate electrode 15c wherein the word line is arranged in a folded bit line scheme. Therefore, the first word line 15c extends over the isolation oxide film 10 such that it connects gate electrodes of adjacent memory cells M to each other. A bit line 6 is located in a higher layer than the first word line 15c, wherein the bit line is connected to the bit line contact 8. A second word line 15b of aluminum is in a still higher layer than the bit line layer wherein the second word line 15b is connected in parallel to the first word line 15c.

In a semiconductor memory such as that described above, if the integration density is increased from a 64-Mbit DRAM such as that shown in FIG. 17A to a 256-Mbit DRAM or further to a 1-Gbit DRAM, the area of each memory cell occupying a semiconductor substrate must be reduced.

However, reduction of the area of each memory cell is limited, since the capacitance of a capacitor should be greater than a certain value. To prevent erroneous operation of a memory circuit, or soft errors, due to the generation of electron-hole pairs in a semiconductor substrate induced by alpha-particles in a DRAM package, the capacitor should have a capacitance of at least 40 fF.

One known technique to achieve such a large capacitance in a small area of a semiconductor substrate is to employ a capacitance structure such as a stacked-type capacitor which has a cross section such as that shown in FIG. 17B (17A), in which a second storage node 7a, called a hemispherical grain (HSG) poly-silicon storage node, is added to a first common storage node 7. However, the memory cell according to this technique has so complicated a structure that an increase in the number of production process steps and thus a reduction in production yield occur, which leads to an increase in production cost.

Furthermore, this technique also has problems due to short-channel effects as well as narrow-channel effects which occur in channel regions of MIS transistors. That is, if the channel length is reduced, then the threshold voltage becomes lower and dependence of the variation in the threshold voltage on channel length becomes greater. Furthermore, the threshold voltage increases due to the lateral expansion of a depletion region, which is called a narrow-channel effect. In a pinch-off region near the end of drain region, hot carriers are generated by impact ionization. These hot carriers may cause long-term degradation in characteristics of a transistor, which is known as the hot carrier effect. This causes a problem with reliability. If the channel length or channel width is reduced to a submicron order, problems occur in the channel region as described above. As a result, it is very difficult to reduce the device size.

SUMMARY OF THE INVENTION

It is an object of the present invention to solve the problems described above. More specifically, it is an object of the present invention to provide a high-density semiconductor memory comprising a memory cell with a simple structure including no transistors, thereby avoiding an increase in the complexity of the structure and also avoiding an increase in the number of production steps and thus achieving high-density integration with small-sized devices at a low cost. It is another object of the present invention to provide a method of producing such a semiconductor memory.

According to one aspect of the present invention, there is provided a semiconductor memory comprising a memory cell, the memory cell comprising no transistors but comprising: a first word line; a first dielectric film adjacent to the first word line; a bit line formed such that the bit line is adjacent to the first dielectric film; a second dielectric film adjacent to the bit line; an information charge storage layer adjacent to the second dielectric film; a third dielectric film adjacent to the information charge storage layer; and a second word line adjacent to the third dielectric film wherein at least either the dielectric constant or the area of the second dielectric film is smaller than the dielectric constant or the area of the first dielectric film and than the dielectric constant or the area of the third dielectric film.

According to another aspect of the present invention, there is provided a semiconductor memory comprising a memory cell, the memory cell comprising no transistors but comprising: a first word line comprising an impurity diffusion layer on a primary surface of a silicon substrate; a first dielectric film comprising a silicon oxide film adjacent to the first word line; a bit line comprising polycrystalline silicon containing impurities and adjacent to the first dielectric film; a second dielectric film comprising a tunnel oxide film and adjacent to the bit line, the dielectric constant or the area of the tunnel oxide film being smaller than the dielectric constant or the area of the first dielectric film and than the dielectric constant or the area of a third dielectric film; an information charge storage layer comprising polycrystalline silicon containing impurities and adjacent to the second dielectric film; a third dielectric film comprising a silicon oxide film and adjacent to the information charge storage layer; and a second word line comprising polycrystalline silicon containing impurities and adjacent to the third dielectric film.

According to still another aspect of the present invention, there is provided a semiconductor memory comprising a memory cell, the memory cell comprising no transistors but comprising: a second word line comprising an impurity diffusion layer on a primary surface of a silicon substrate; a third dielectric film comprising a silicon oxide film and adjacent to the second word line; an information charge storage layer comprising polycrystalline silicon containing impurities and adjacent to the third dielectric film; a second dielectric film comprising a tunnel oxide film adjacent to the information charge storage layer, the dielectric constant or the area of the tunnel oxide film being smaller than the dielectric constant or the area of a first dielectric film and than the dielectric constant or the area of the third dielectric film; a bit line comprising polycrystalline silicon containing impurities and adjacent to the second dielectric film; a first dielectric film comprising a silicon oxide film adjacent to the bit line; and a first word line comprising polycrystalline silicon containing impurities and adjacent to the first dielectric film.

According to another aspect of the present invention, there is provided a method of producing a semiconductor memory comprising a memory cell including no transistors, comprising the steps of: forming a device element isolation film in a predetermined area of a primary surface of a silicon substrate; implanting an impurity using the device element isolation film as a mask to form a first word line comprising an impurity diffusion layer such that the first word line is arranged in the X-direction; forming a first dielectric film comprising a thin silicon oxide film on the word line; forming a bit line comprising polycrystalline silicon containing impurities on the first dielectric film, such that the bit line is arranged in the Y-direction; depositing an insulating layer on the bit line; removing the insulating layer from a predetermined area where the first word line and the bit line intersect each other; forming a second dielectric film comprising a tunnel oxide film on the surface of the bit line exposed in the area from which the insulating film has been removed, the dielectric constant or the area of the tunnel oxide film being smaller than the dielectric constant or the area of the first dielectric film and than the dielectric constant or the area of a third dielectric film; forming an information charge storage layer comprising polycrystalline silicon containing impurities on the second dielectric film; forming the third dielectric film comprising a silicon oxide film on the information charge storage layer; and forming a second word line comprising polycrystalline silicon containing impurities on the third dielectric film, such that the second word line is arranged in the X-direction.

According to further aspect of the present invention, there is provided a method of producing a semiconductor memory comprising a memory cell including no transistors, comprising the steps of: forming a device element isolation film in a predetermined area of a primary surface of a silicon substrate; implanting an impurity using the device element isolation film as a mask to form a second word line comprising an impurity diffusion layer such that the second word line is arranged in the X-direction; forming a third dielectric film comprising a silicon oxide film on the second word line; forming an information charge storage layer comprising polycrystalline silicon containing impurities on the third dielectric film; depositing an insulating layer on the information charge storage layer; removing the insulating layer from a predetermined area; forming a second dielectric film comprising a tunnel oxide film on the surface of the information charge storage layer exposed in the area from which the insulating film has been removed, the dielectric constant or the area of the tunnel oxide film being smaller than the dielectric constant or the area of a first dielectric film and than the dielectric constant or the area of the third dielectric film; forming a bit line comprising polycrystalline silicon containing impurities on the second dielectric film such that the bit line is arranged in the Y-direction; forming a first dielectric film comprising a silicon oxide film on the bit line; and forming a first word line comprising polycrystalline silicon containing impurities on the first dielectric film such that the .first word line is arranged in the X-direction.

BRIEF DESCRIPTION OF THE DRAWINGS

FIGS. 6A to 6J are cross-sectional views illustrating the operation of an embodiment of a memory cell array for use in a semiconductor memory according to the present invention;

DESCRIPTION OF THE PREFERRED EMBODIMENTS

Figure 1:
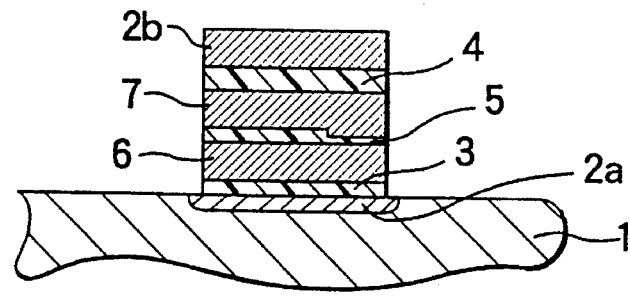
FIG. 1 is a cross-sectional view of a basic structure of an embodiment of a memory cell for use in a semiconductor memory according to the present invention.

FIG. 1 illustrates a basic structure of a memory cell used in a semiconductor memory embodying the present invention. In FIG. 1, a first word line $2a$ is an n-type region disposed at the primary surface of a p-type silicon substrate 1. A bit line 2 of polycrystalline silicon doped with n-type impurities is disposed on the first word line $2a$ via a first dielectric film 3, a silicon oxide film. Furthermore, a storage node 7 acting as an information charge storage layer made of polycrystalline silicon doped with n-type impurities is disposed on the bit line 6 via a second dielectric film 5, a tunnel oxide film whose area is less than that of first dielectric film 3 and less than that of a third dielectric film 4. The second dielectric film 5 provides a function similar to that of a MIS transistor in a conventional memory cell structure. That is, charge is stored in and extracted from the storage node 7 via the second dielectric film 5. A second word line $2b$ made of polycrystalline silicon doped with n-type impurities is disposed on the storage node 7 via a third dielectric film 4, a silicon oxide film.

Figure 2:
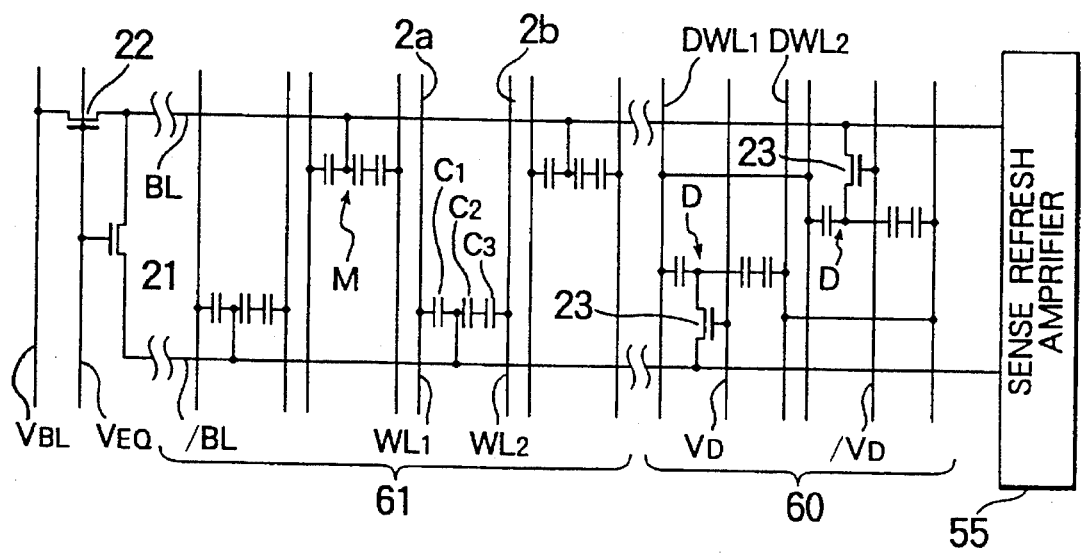
FIG. 2 is an equivalent circuit diagram of an embodiment of a memory cell array for use in a semiconductor memory according to the present invention.
Figure 16:
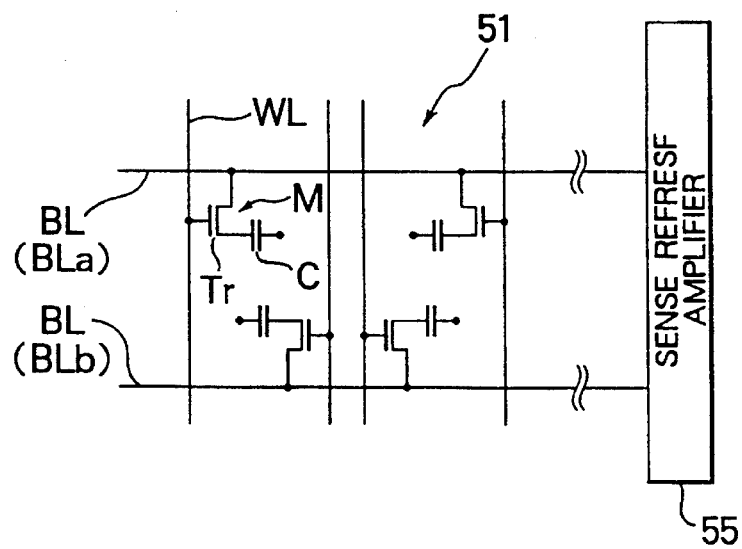
FIG. 16 is an equivalent circuit diagram of a conventional memory cell array for use in a semiconductor memory.
Figure 17A:
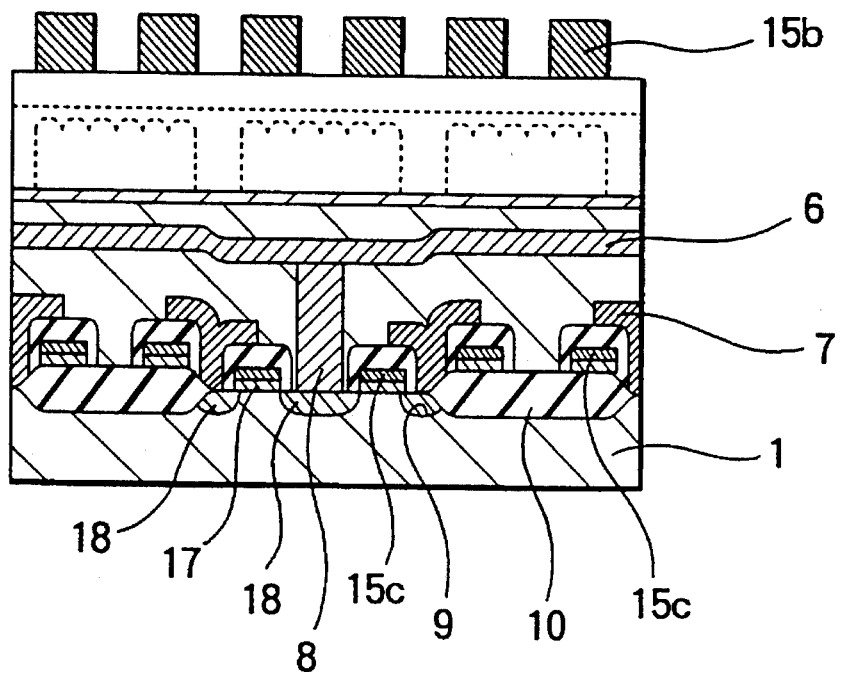
FIGS. 17A and 17B are cross-sectional views of a conventional memory cell array for use in a semiconductor memory.
Figure 17B:
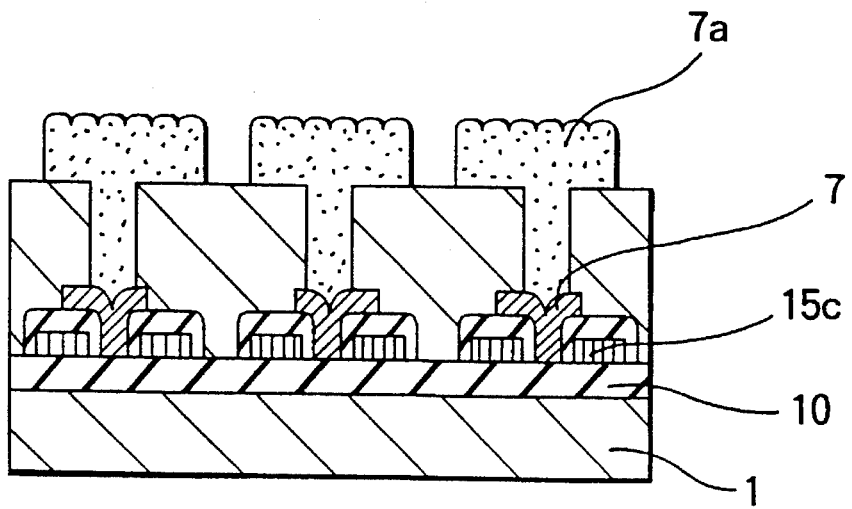

FIG. 2 illustrates an equivalent circuit of four memory cells (each cell may store one-bit of information) of the present invention, corresponding to the conventional cells shown in FIG. 16. As shown in the figure, there are provided a plurality of word lines WL extending in the X- (row-) direction, wherein each word line WL comprises a first word line $2a$ and a second word line $2b$. There are also provided a plurality of pairs of bit lines (BL, $\overline{BL}$) extending in the Y-(column) direction. Memory cells M are formed in the vicinity of word and bit lines, as in conventional cells. In the present invention, a memory cell M equivalently comprises the following three capacitors: a capacitor $C_1$ comprising a first dielectric film 3 disposed between a first word line $2a$ and a bit line 6; and two capacitors $C_2$ and $C_3$ connected in series between the bit line 6 and a second word line $2b$, wherein the capacitor $C_2$ comprises a tunnel oxide film or a second dielectric film 5, and the capacitor $C_3$ comprises a third dielectric film 4. In FIG. 2, a pair of bit lines (BL, $\overline{BL}$) are disposed in extending toward a sense refresh amplifier 55 in a fashion of the folded bit line scheme. In FIG. 2, there are also shown a dummy cell array 60, a memory cell array 61, an equalizing transistor 21, a $V_{BL}$ transistor 22, and a dummy cell transistor 29, which will be described later in connection with the operation principle.

Referring again to FIG. 1, it will be described why the area of the second dielectric film 5 or the tunnel oxide film is designed to be smaller than that of the first dielectric film 3 and than that of the third dielectric film 4. This is required if the first, second, and third dielectric films are all made of the same kind of material such as a silicon oxide film. That is, the above requirement should be met if these dielectric films are all made of a material having the same dielectric constant $\epsilon$. In a memory cell of the present invention, charge is stored in and extracted from the storage node 7 via the tunnel oxide film 5, by applying a voltage between the first word line 2a and the second word line 2b (which will be described in more detail in connection with the operation principle). If a voltage is simply applied between the first word line 2a and the second word line 2b, the same amount of charge Q is stored in each of three capacitors $C_1$, $C_2$, and $C_3$.

The charge Q is determined by:

$$Q = CV = \epsilon AV/d \tag{1}$$

where $\epsilon$ is the dielectric constant, A is the area, d is the distance between electrodes, and V is the applied voltage. If dielectric constants, areas, distances between electrodes, and applied voltages are denoted by $\epsilon_1$, $A_1$, $d_1$, $V_1$, and $\epsilon_2$, $A_2$, $d_2$, $V_2$ for capacitors $C_1$ and $C_2$, respectively, then there is a relationship between these parameters which can be written as $$\epsilon_1 A_1 V_1/d1 = \epsilon_2 A_2 V_2/d2 \tag{2}$$

Both capacitors $C_1$ and $C_2$ are made of the same kind of material, thus $\epsilon_1 = \epsilon_2$. The tunnelling current flowing through the tunnel oxide film depends on the magnitude of the electric field E applied across the tunnel oxide film. Furthermore, E is given by $$E = V/d \tag{3}$$

so that if the area $d_2$ is sufficiently small, then the electric field across the capacitor $C_2$ becomes large and thus it becomes possible that a tunnelling current may flow.

On the other hand, if the tunnel oxide film 5 is made of a material having a dielectric constant $\epsilon$ smaller than that of the first dielectric film 3 and than that of the third dielectric film 4, then it is possible that three dielectric films may have areas equal to each other according to equation 2. For example, the tunnel oxide film 5 may be made of a silicon oxide film, and the first and third dielectric films 3 and 4 may be made of a silicon nitride (SIN) film, a mixed crystal of $BaTiO_3$ and $SrTiO_3$, or other materials having a dielectric constant greater than that of the silicon oxide film. A preferable thickness of the tunnel oxide film is in the range from 1 nm to 5 nm.

Figure 3:
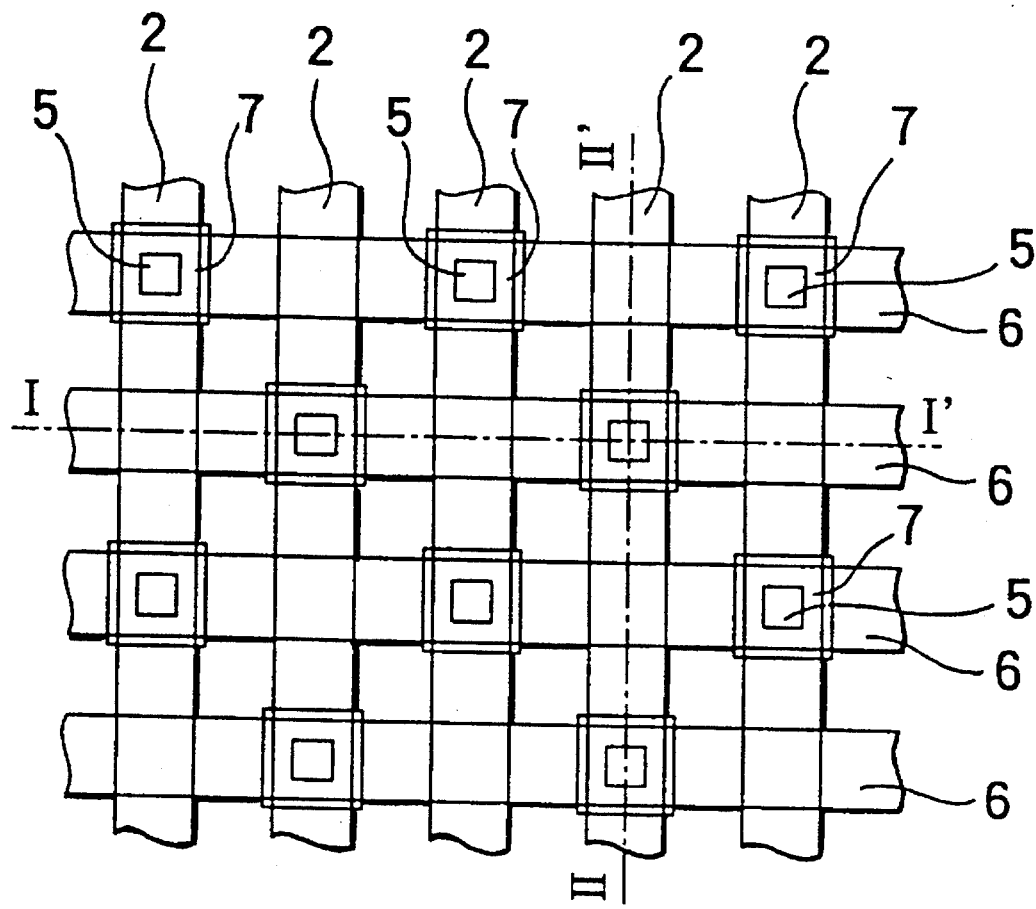
FIG. 3 is a plan view of an embodiment of a memory cell array for use in a semiconductor memory according to the present invention.
Figure 4:
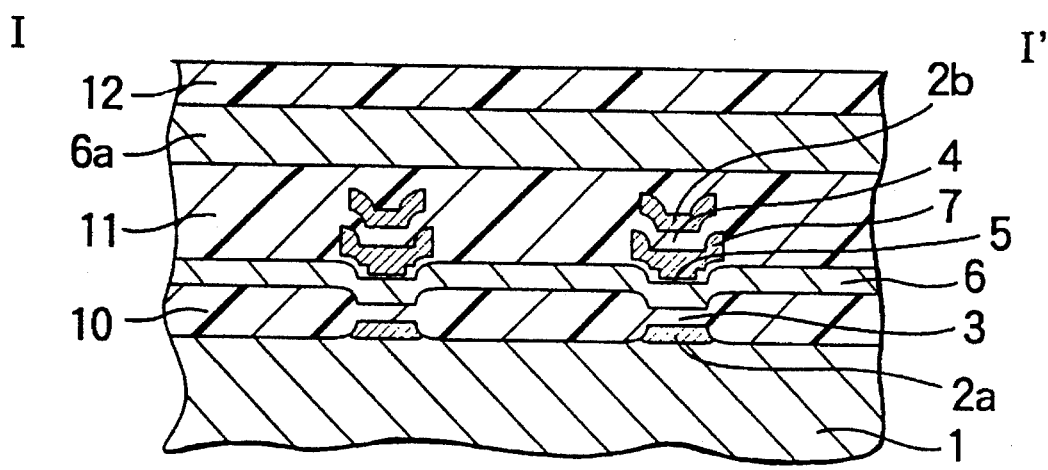
FIG. 4 is a cross-sectional view of an embodiment of a memory cell array for use in a semiconductor memory according to the present invention.
Figure 5:
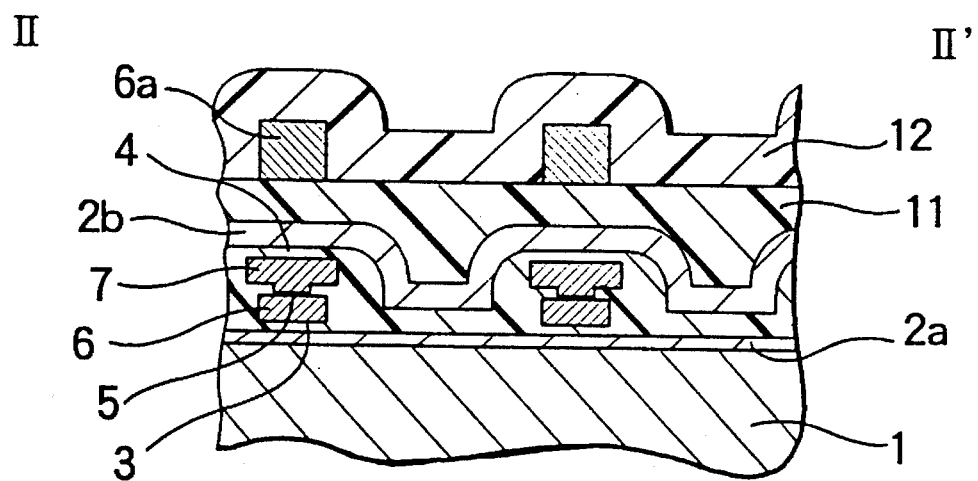
FIG. 5 is a cross-sectional view of an embodiment of a memory cell array for use in a semiconductor memory according to the present invention.

Now, an example of a memory cell array structure embodying the present invention will be described below. FIG. 3 is a plan view of an embodiment of a memory cell array according to the present invention. FIG. 4 is a cross-sectional view taken along the line I—I' of FIG. 3, and FIG. 5 is a cross-sectional view taken along-the line II—II' of FIG. 3.

In FIG. 3, first and second word lines 2 are disposed in the X-direction, and bit lines 6 are disposed in the Y-direction. Since these lines are arranged in a folded bit line scheme, a storage node 7 forming a memory cell is disposed at every intersection of word lines 2 and bit lines 6. In FIG. 4, first word lines 2a are n-type diffused regions in a p-type silicon substrate 1 isolated from adjacent memory cells by an isolation oxide film 10. Bit lines 6 polycrystalline silicon doped with n-type impurities are disposed on the first word lines 2a via the first dielectric film 3, a silicon oxide film. In FIG. 4, there is shown a bit line 6 which is arranged in the Y-direction and which connects adjacent memory cells to each other. Furthermore, storage nodes 7 of polycrystalline silicon doped with n-type impurities are disposed on the bit line 6 via a second dielectric film 5, a tunnel oxide film having a thickness smaller than the thickness of the first and third dielectric films 3 and 4, wherein the tunnel oxide film 5 has an area smaller than that of the first dielectric film 3.

A second word line 2b formed of polycrystalline silicon doped with n-type impurities is disposed on storage nodes 7 via the third dielectric film 4 formed of a silicon oxide film. In FIG. 5, a first word line 2a formed of an n-type impurity diffusion layer and a second word line 2b formed of polycrystalline silicon are disposed in the X-direction, wherein adjacent memory cells are coupled through these lines 2a and 2b. Second bit lines 6a formed of aluminum are disposed on the first word line 2b via a flattened interlayer-isolation film 11 formed of a silicon oxide film wherein the second bit lines 6a are coupled in parallel to the respective first bit lines 6. A surface protection film 12 formed of a silicon nitride film is disposed at on the second bit lines 6a such that the entire surface is covered with the surface protection film 12.

Figure 15:
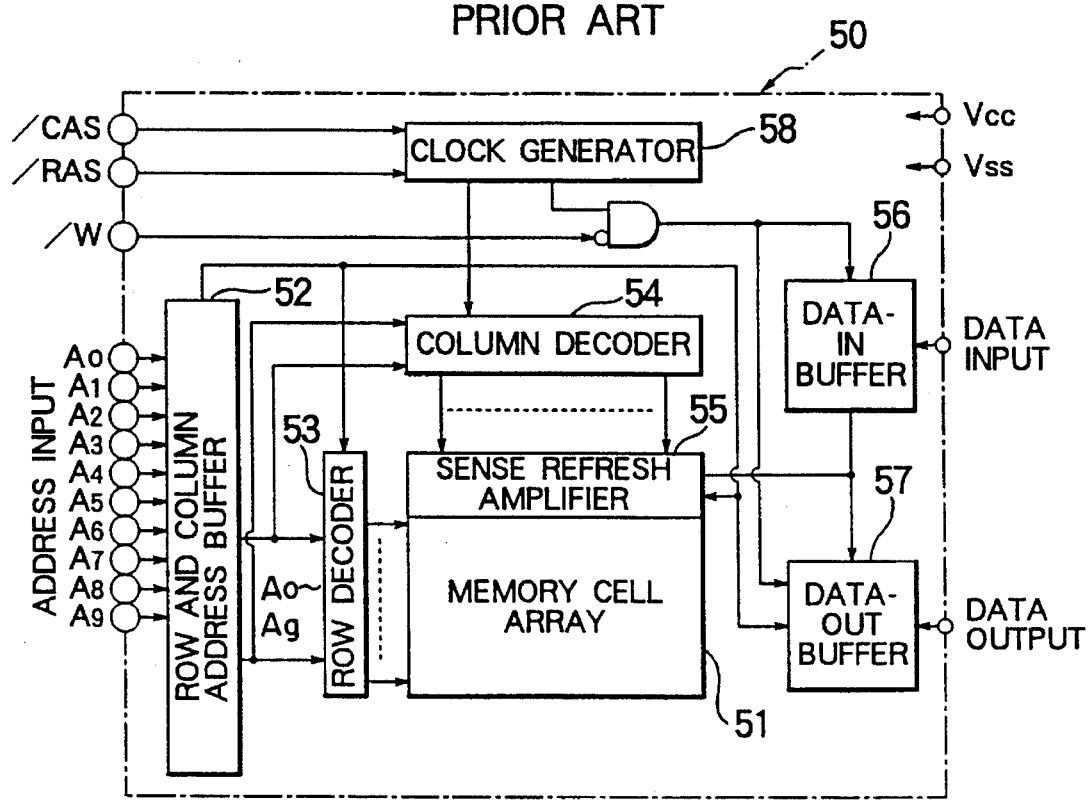
FIG. 15 is a block diagram illustrating a conventional DRAM.

The operation principle of the memory cell array of the present invention will be described below. The other circuits except for the memory cell array are configured in a manner similar to that of the conventional technique shown in the block diagram of FIG. 15, and operate in basically the same manner as in the case of the conventional technique. However, the memory cell array operates in an absolutely different way from that of the conventional one which has been described earlier in connection with FIG. 16.

FIGS. 6A to 6J are energy band diagrams illustrating the operation principle of the memory cell array of the present invention. In the figure, the region of a first word line 2a is denoted by 100, the region of a first dielectric film is denoted by 200, the region of a bit line 6 is denoted by 300, the region of a tunnel oxide film 5 is denoted by 400, the region of a storage node 7 is denoted by 500, the region of a third dielectric film 4 is denoted by 600, and the region of a second word line is denoted by 700. In this figure, horizontal lines in regions 100, 300, 500, and 700, that is, regions formed of silicon, denote Fermi levels.

The writing operation will be described first. Among FIGS. 6A–6D, FIGS. 6A and 6C illustrate the "0"-write operation in which electrons acting as carriers in an n-type silicon are injected into a storage node, and FIGS. 6B and 6D illustrate the "1"-write operation in which no electrons are injected into the storage node.

FIGS. 6A and 6B illustrate states before the start of writing operation, in which the first and second word line regions 100 and 700 are at 5 V. In FIG. 6A, the bit line region 300 is charged to 0 V so that electrons may be injected.

In FIG. 6B, in contrast to FIG. 6A, the bit line region 300 is kept at 5 V, and thus the region 300 is not charged. The voltage of the first word line region 100 is then changed to 0 V. Then, in the case where the bit line region 300 has been charged to 0 V, the potential of the bit line region 300 is raised, and thus electrons in the bit line region 300 are transferred to the storage node region 500 according tunneling, as shown in FIG. 6C. In this transfer process, since the tunnel oxide film region 400 has an area smaller than the area of the third dielectric film region 600, only the electric field E applied across the tunnel oxide film region 400 can have a value sufficiently large for tunneling to occur.

The lower portion of FIG. 6C illustrates a state after the completion of the electron transfer, in which the potential of the storage node has been raised by the transferred electrons.

When the bit line region 300 is put in a stand-by state in which the bit line region 300 is at 0 V, since the electric field E across the tunnel oxide film region 400 is smaller than the lowest value required for the tunnel effect to occur, no electrons are transferred, and thus "0"-data is maintained unchanged. On the other hand, in the case of FIG. 6D, since the bit line region 300 has not been charged, no electrons are transferred to the storage node region 500. The lower portion of FIG. 6D illustrates a state in which the bit line region 300 is in a stand-by state, that is, the bit line region 300 is at 0 V. In this case, since the electric field E across the tunnel oxide film region 400 is less than the lowest value required to induce the tunnel effect, no electrons are injected into the storage node region 500, and thus "1"-data is maintained unchanged.

Now, reading operation will be described. FIGS. 6E–6J illustrate reading operation, wherein FIGS. 6E, 6G, and 6I illustrate "0"-reading operation, and FIGS. 6F, 6H, and 6J illustrate "1"-reading operation.

In FIGS. 6E and 6F, the voltage of the second word line region 700 has been changed to 0 V from the prior stand-by state in which the voltages of the first and second word line regions 100 and 700 were 5 V (the voltage relationship between the first and second word lines is opposite to that in the writing operation). In the case of FIG. 6E, the storage node region 500, which has been charged to 0 V in the prior state, is raised in potential and thus electrons in the storage node region 500 are transferred to the bit line region 300 due to tunneling.

On the other hand, in the case of FIG. 6F, since the potential of the storage node 500 is not raised, no electrons are transferred. FIGS. 6G and 6H illustrate states which are reached when a certain time has elapsed after the states shown in FIGS. 6E and 6F in which the voltage of the second word line 700 was changed to 0 V. In these states, discharge occurs and therefore the potential of the bit line region 300 which has been charged to 0 V in the stand-by state is lowered. However, in the case of FIG. 6G in which electrons have been transferred from the storage node region 500 to the bit line region 300, the potential of the bit line 300 becomes slightly greater than in the case of FIG. 6H. In the lower portions of FIGS. 6G and 6H, this slight potential difference is enlarged to 0 V (i-state) and 5 V (j-state), respectively, which are achieved by amplifying the respective voltages using the sense refresh amplifier 55.

The amplification operation of the sense refresh amplifier 55 will be described in greater detail. In FIG. 2, a pair of bit lines 6 are parallel and extend toward the sense refresh amplifier 55 in a folded bit line scheme, in which one bit line is called BL and the other bit line is called $\overline{BL}$. When the voltage of the second word line 2b corresponding to the specified address becomes 0 V, information is read out through one of bit lines 6, that is, either BL or $\overline{BL}$. When information is read out, for example, through BL of the bit lines 6, the other bit line 6 ($\overline{BL}$) through which no information is read out must be at the reference voltage which is used as the reference in the comparison of voltage difference. That is, the signal on the line BL is amplified by the sense refresh amplifier using the voltage on the line $\overline{BL}$ as the reference voltage. This reference voltage is produced by a dummy cell D such that it has a value intermediate the voltage of the bit line region 300 shown in FIG. 6G and that shown in FIG. 6H.

Figure 7:
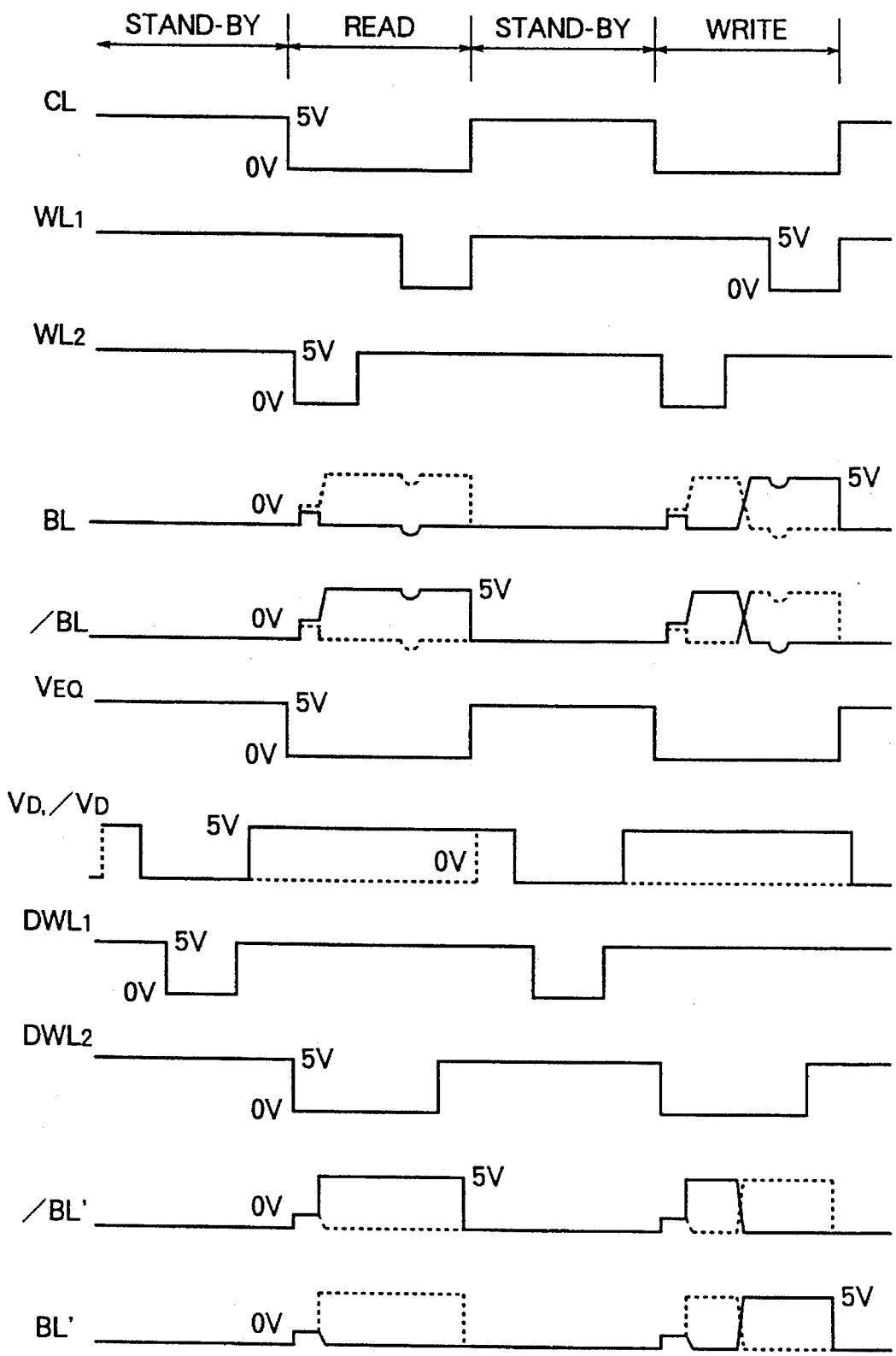
FIG. 7 is a voltage waveform diagram illustrating the operation of an embodiment of a memory cell array for use in a semiconductor memory according to the present invention.

The writing and reading operations of the memory cell which have been described briefly above will be further described referring to voltage signal waveforms shown in FIG. 7. It is assumed here that the memory cell is in a stand-by state when the basic clock signal CL is at 5 V, and in operation states (reading operation or writing operation) when the basic clock signal CL is at 0 V. For easier understanding, the operations will be described in the order of (reading operation)→(stand-by operation)→ (writing operation).

Referring to FIG. 7, in reading operation, the first word line $WL_1$ is at 5 V, and the second word line $WL_2$ is changed to 0 V as shown in FIGS. 6G and 6H. If it is assumed that information is to be read out through the bit line BL, and that "0" has been written on the bit line BL, the voltage of the BL is raised very slightly as shown in FIG. 6G. On the other hand, the bit line $\overline{BL}$ is at the reference voltage produced by the dummy cell D, since the voltage of $\overline{VD}$ is changed to 5 V (the voltage of VD is maintained at 0 V as represented by the broken line) so as to turn on the dummy cell transistor 29 associated with the bit line $\overline{BL}$. In FIG. 7, this reference voltage is represented by $\overline{BL}'$. Since the reference voltage is set to a value intermediate the voltage of the bit line region 300 shown in FIG. 6G and that shown in FIG. 6H as described above, the voltage of BL is slightly lower than the voltage of $\overline{BL}'$, and thus the sense refresh amplifier 55 amplifies the voltage BL to 0 V and $\overline{BL}$ to 5 V. In the case where "1" has been written on BL, the waveforms associated with BL and $\overline{BL}'$ are represented by the broken lines. If "1" has been written on $\overline{BL}$, the waveforms associated with BL and corresponding BL' are represented by the solid lines (inverted to BL). If "0" has been written on $\overline{BL}$, the waveforms associated with $\overline{BL}$ and $\overline{BL}'$ are such that represented by the broken lines.

In the reading operation, writing is also performed subsequently after the completion of the reading. This is because when the voltage of the second word line 2b corresponding to the specified address becomes 0 V in the reading operation, information is read out from all memory cells connected to this second word line 2b. That is, in the case where "0" is read out through a bit line BL, or "1" is read out through a bit line $\overline{BL}$, carriers (electrons) are extracted from storage node regions 500. Therefore, these carriers must be re-injected into respective storage node regions 500. Otherwise, information stored in memory cells connected to the word line 2 corresponding to the specified address wherein these memory cells have no direct relationship to the reading operation would be erased. At the beginning of this writing step in the reading operation, the voltage of the second word line $WL_2$ is changed to 5 V so that the voltage may become equal to voltages of the first and second word lines 2a and 2b in a stand-by state which will be described later. At this point, the voltages of BL and $\overline{BL}$ are maintained at 0 V or 5 V, since the sense refresh amplifier 55 is still in operation. Then, the voltage of the first word line is changed to 0 V. As a result, the situation becomes as shown in FIGS. 6C or 6D. In the case where the voltage of the bit line was 0 V, electrons are injected again into the storage node region 500 so that the data may be held. When electrons are injected, as can been seen from the waveforms in FIG. 7, the bit lines become higher in potential and thus lower in voltage for an instant, in both cases of 0 V and 5 V, relative to the potentials at which the bit lines were before the voltage of the first word line 2a has been changed to 0 V.

Now, the stand-by state will be described below. In a stand-by state, the first and second word lines $WL_1$ and $WL_2$ are both at 5 V, and the bit line is at 0 V. In the stand-by state, the voltages of bit lines BL and $\overline{BL}$ should be equal to each other. This is achieved by using 5V as $V_{EQ}$ so as to turn on the equalizing transistor 21 thereby fixing the bit line voltages at 0 V through the $V_{BL}$ transistor 22. The lower portions of FIGS. 6C and 6D illustrate stand-by states. The electric field across the tunnel oxide film is less than the lowest value required to induce the tunnel effect in both cases where electrons have been injected and not injected into the storage node region 500, and thus, stored data can be held.

Furthermore, in the stand-by state, writing into the dummy cell D (electrons are injected into the storage node region 500) is also performed so as to produce the reference voltage which is used in the reading operation. To inject electrons into both dummy cells associated with BL and $\overline{BL}$, 5 V is applied to both $V_D$ and $X\bar{V}_D$, and 5 V is also applied to both $DWL_1$ and $DWL_2$ connected to dummy cells which correspond to the first and second word lines. As a result, 0 V is applied to bit line regions 300 of dummy cells D through BL and $\overline{BL}$. Then, the voltages on $V_D$ and $X\bar{V}_D$ are changed to 0 V (dummy cells are isolated from the BL and $\overline{XBL}$ of memory cells) so that bit line regions 300 of dummy cells D may come into floating states. The voltage of $DWL_1$ is then changed to 0 V so that the state may become such as that shown in FIG. 6C, and thus electrons are injected into the storage node region 500. The capacitance of the capacitor $C_1$ should be optimized such that the quantity of electrons injected into the storage node 500 may cause the voltage of the bit line region 300 to have a value, in a reading operation, intermediate the voltage such as that shown in FIG. 6G and the voltage such as that shown in FIG. 6H.

Finally, writing operation will be described. The writing operation is performed in basically the same manner as in reading operation. That is, reading is performed first, and writing is then performed. Reading before writing is necessary to remove the electrons injected into the storage node region 500. In the subsequent writing step, external voltages are applied to BL and $\overline{BL}$. In FIG. 7, a writing operation in which "0" is written through BL ("1" through $\overline{BL}$) is represented by solid waveforms.

In the above, the memory cell according to the present invention has been described.

A method of producing a memory cell array of the present invention having such a structure shown in FIGS. 3–5 will be described below. FIGS. 8A to 8J illustrates cross sections of a memory cell array of the present invention in various steps in a production flow, wherein the memory cell has a structure corresponding to that shown in FIGS. 4 and 5.

Figure 8A:
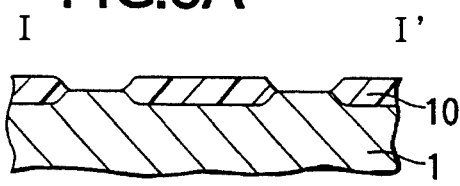
FIGS. 8A to 8J are cross-sectional views of an embodiment of the memory cell array according to the present invention, illustrating various steps in a production flow.
Figure 8B:
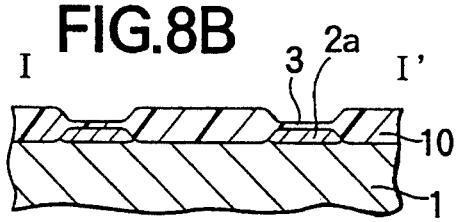

First, a p-type silicon substrate 1 is prepared. Then, a thick silicon oxide film is formed by selectively oxidizing predetermined areas of the primary surface of the p-type silicon substrate 1 so as to form an isolation oxide film 10 for isolating device elements from each other. At this point, the cross section taken along the line I—I' of FIG. 3 is shown in FIG. 8A. Ion implantation is then performed using the isolation oxide film 10 as a mask so as to form first word lines 2a comprising an n-type impurity diffusion layer. Then, thermal oxidation is performed so as to form a silicon oxide film acting as a first dielectric film (FIG. 8B).

Figure 8C:
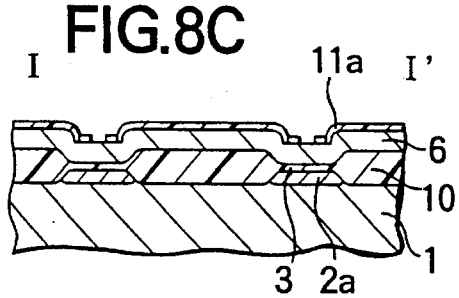
Figure 8D:
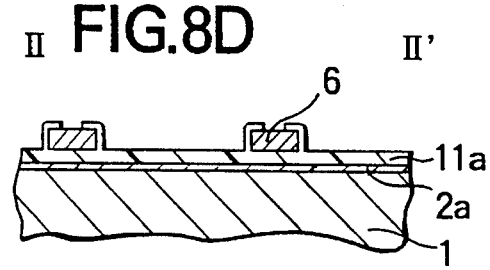
Figure 8E:
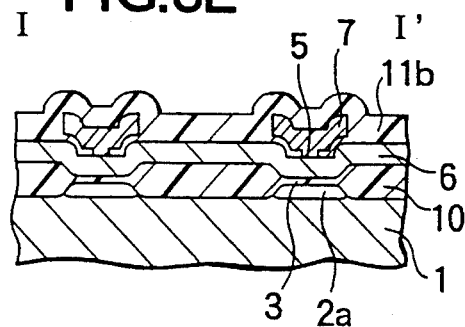
Figure 8F:
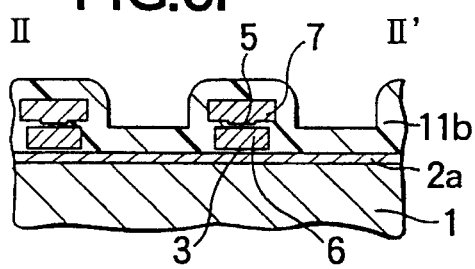

Furthermore, bit lines 6 are formed with polycrystalline silicon doped with n-type impurities in a layout pattern as shown in FIG. 3. Subsequently, a silicon oxide film 11a is deposited on the entire surface, and then only portions corresponding to the tunnel oxide film 5 shown in FIG. 3 are removed by means of wet etching. At this point, the cross section taken along the line I—I' of FIG. 3 is shown in FIG. 8C, and the cross section taken along the line II—II' of FIG. 3 is shown in FIG. 8D. Furthermore, thermal oxidation is carried out to form a silicon oxide film acting as a second dielectric film (tunnel oxide film) 5. Storage nodes 7 are then formed with polycrystalline silicon doped with n-type impurities. Then, a silicon oxide film 11b is deposited on the entire surface. At this point, the cross section taken along the line I—I' of FIG. 3 is shown in FIG. 8E, and the cross section taken along the line II—II' of FIG. 3 is shown in FIG. 8F.

Figure 8G:
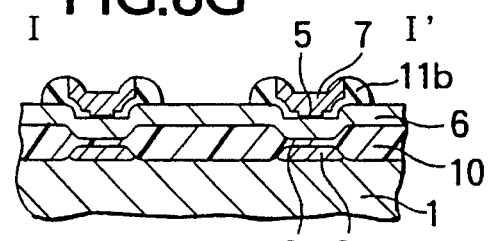
Figure 8H:
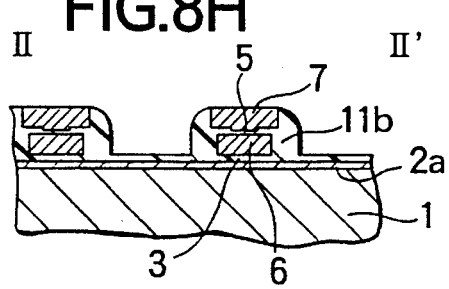

Then, anisotropic RIE (reactive ion etching) is performed on the entire surface to remove the silicon oxide film 11b. At this point, the cross section taken along the line I—I' of FIG. 3 is shown in FIG. 8G, and the cross section taken along the line II—II' of FIG. 3 is shown in FIG. 8H. Since the silicon oxide film 11b is thicker at sides of the storage nodes 7 and the bit lines 6, the silicon oxide film in these side regions remains as side walls. Then, a thin silicon oxide film is deposited on the entire surface to form a third dielectric film 4.

Figure 8I:
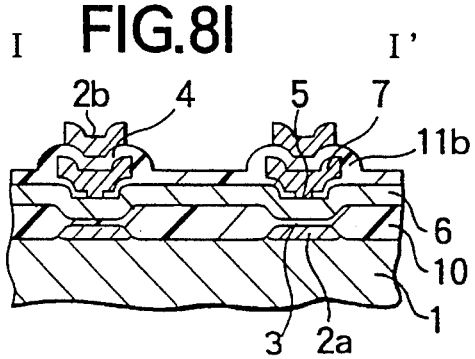
Figure 8J:
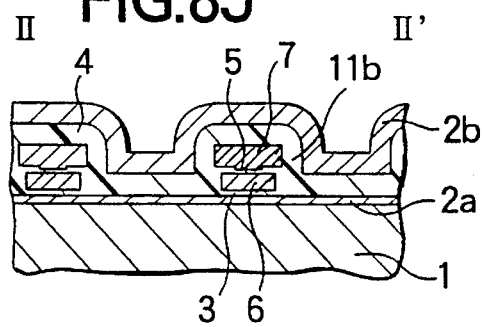

Furthermore, second word lines 2b are formed with polycrystalline silicon doped with n-type impurities in a layout pattern as shown in FIG. 3. At this point, the cross section taken along the line I—I' of FIG. 3 is shown in FIG. 8I, and the cross section taken along the line II—II' of FIG. 3 is shown in FIG. 8J. As can be seen from FIG. 8J, side walls of silicon oxide film 11b reduce capacitive coupling between the second word lines 2b and the storage nodes 7 or bit lines through the side wall portions. Then, a flat silicon oxide film is deposited on the entire surface, and second bit lines 6b are formed with aluminum in a layout pattern shown in FIG. 3. Finally, a surface protection film 12 of silicon nitride is deposited. Thus, a memory cell array structure ms complete.

Figure 9:
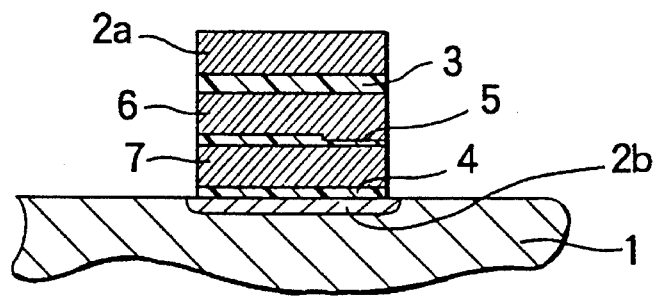
FIG. 9 is a cross-sectional view illustrating a basic structure of another embodiment of a memory cell for use in a semiconductor memory according to the present invention.

Another embodiment of a memory cell array structure for use in a semiconductor memory according to the present invention will be described below. First, the basic structure of this memory cell array will be described. FIG. 9 is a cross-sectional side view of the memory cell. In comparison with the structure shown in FIG. 1, the interconnection structure of the memory cell of FIG. 9 is basically opposite to that of FIG. 1. In FIG. 9, a second word line 2b of an n-type impurity diffusion layer is disposed on the primary surface of a p-type silicon substrate 1. A storage node 7 of polycrystalline silicon doped with n-type impurities is disposed on the second word line 2b via a third dielectric film 3, a silicon oxide film.

Furthermore, a bit line 6 of polycrystalline silicon doped with n-type impurities is disposed on the storage node 7 via a second dielectric film 5, a tunnel oxide film whose thickness is less than that of the first dielectric film 3 and than that of the third dielectric film 4. The tunnel oxide film 5 provides a function similar to that of an MIS transistor in a conventional memory cell structure. That is, charge is stored in or extracted from the storage node 7 via the tunnel oxide film 5. A first word line 2a made of polycrystalline silicon doped with n-type impurities is disposed on the bit line 6 via the first dielectric film 3, a silicon oxide film.

Figure 10:
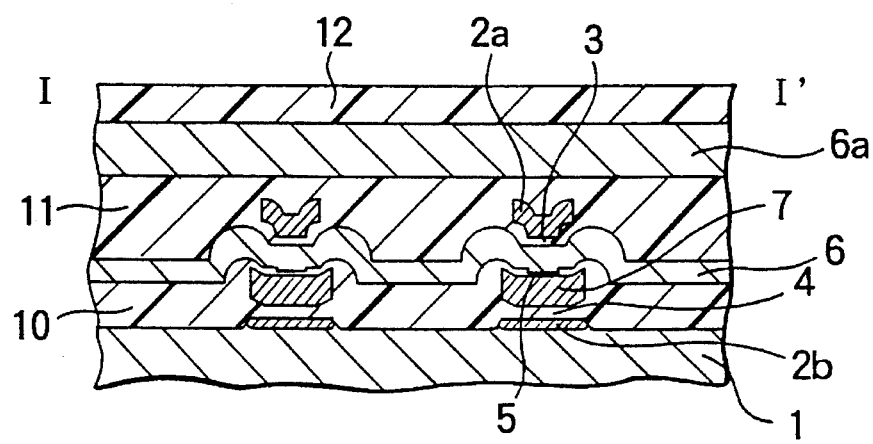
FIG. 10 is a cross-sectional view of another embodiment of a memory cell array for use in a semiconductor memory according to the present invention.
Figure 11:
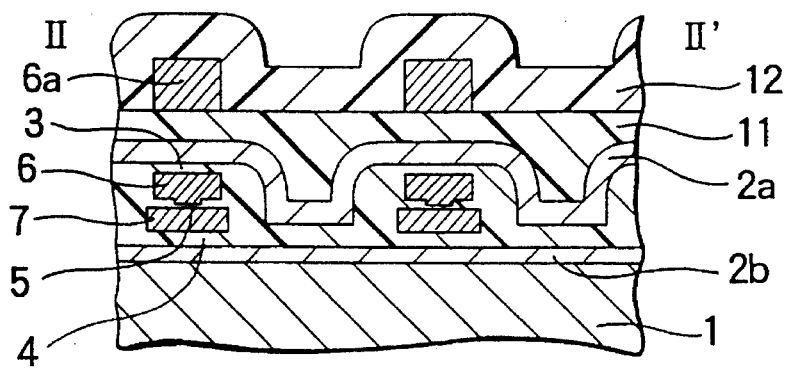
FIG. 11 is a cross-sectional view of the embodiment of the memory cell array for use in a semiconductor memory according to the present invention.

Now, an example of a memory cell array structure comprising memory cells having a structure such as that shown in FIG. 9 will be described below. The plan view of this memory cell array is absolutely the same as that of the previous embodiment described in connection with FIG. 3. However, the memory cell array has a different cross-sectional structure from the previous embodiment. FIG. 10 is a cross-sectional view taken along the line I—I' of FIG. 3, and FIG. 11 is a cross-sectional view taken along the line II—II' of FIG. 3. In FIG. 3, first and second word lines 2a and 2b are disposed in the X-direction, and bit lines 6 are disposed in the Y-direction. Since these lines are arranged in a folded bit line scheme, a storage node 7 forming a memory cell is disposed at every intersection of word lines 2 and bit lines 6. In the above-described points, the memory cell array structure of the present embodiment is exactly the same as that of the previous embodiment.

In FIG. 10, second word lines 2b, n-type regions in a p-type silicon substrate 1, are isolated from adjacent memory cells by an isolation oxide film 10. Storage nodes 7 of polycrystalline silicon doped with n-type impurities are disposed on the second word lines 2b via a third dielectric film 4, a silicon oxide film. Furthermore, bit lines 6 of polycrystalline silicon doped with n-type impurities are disposed on the storage nodes 7 via a second dielectric film 5, a tunnel oxide film having a thickness smaller than those of first and third dielectric films 3 and 4, wherein the tunnel oxide film has an area smaller than that of the third dielectric film 4.

In FIG. 10, there is shown a bit line 6 disposed in the Y-direction so that the bit line 6 connects adjacent memory cells to each other. First word lines 2a of polycrystalline silicon doped with n-type impurities are disposed on the bit line 6 via the first dielectric film 3, a silicon oxide film. In FIG. 11, a first word line 2a of an n-type impurity diffusion layer and a second word line 2b of polycrystalline silicon are arranged in the X-direction, wherein adjacent memory cells are coupled through these lines 2a and 2b. Second bit lines 6a of aluminum are disposed on the first word line 2a via a flattened interlayer-isolation film 11, a silicon oxide film, wherein the second bit lines 6a are connected in parallel to the respective first bit lines 6. A surface protection film 12, a silicon nitride film, is disposed on the second bit lines 6a so that the entire surface is covered with the surface protection film 12.

The present embodiment of the memory cell array described above in connection with FIGS. 10 and 11 operates according to the principle exactly the same as that of the previous embodiment described earlier in connection with FIGS. 3, 4, and 5.

A method of producing a memory cell array of the present invention having such a structure shown in FIGS. 10 and 11 will be described below. FIGS. 12A to 12D illustrates cross sections of a memory cell array of the present invention in various steps in a production flow.

First, a p-type silicon substrate 1 is prepared. Then, a thick silicon oxide film is formed by selectively oxidizing predetermined areas of the primary surface of the p-type silicon substrate 1 so as to form an isolation oxide film 10. Ion implantation is then performed using the isolation oxide film 10 as a mask so as to form second word lines 2b comprising an n-type impurity diffusion layer. Then, thermal oxidation is performed so as to form a silicon oxide film serving as a third dielectric film 4. Furthermore, storage nodes 7 are formed of polycrystalline silicon doped with n-type impurities. Then, a thick silicon oxide film 11c is deposited on the entire surface.

Figure 12A:
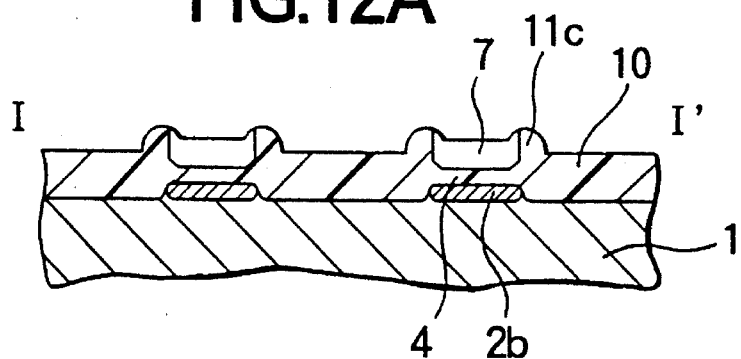
FIGS. 12A to 12D are cross-sectional views of an embodiment of the memory cell array according to the present invention, illustrating various steps in a production flow.
Figure 12B:
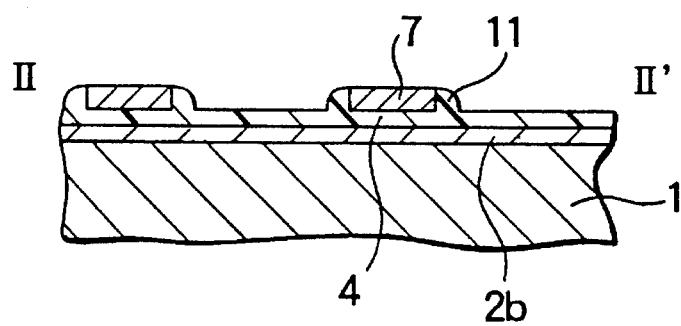
Figure 12C:
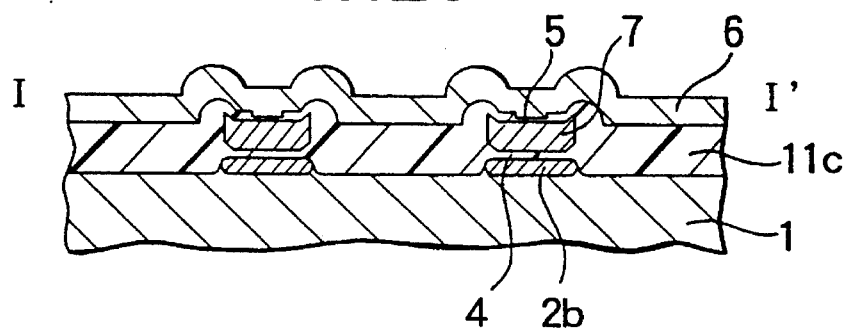

Anisotropic RIE (reactive ion etching) is performed on the entire surface to remove the silicon oxide film 11c. At this point, the cross section taken along the line I—I' of FIG. 3 is shown in FIG. 12A, and the cross section taken along the line II—II' of FIG. 3 is shown in FIG. 12B. Since the silicon oxide film 11c is thicker at sides of the storage nodes 7, these portions of the silicon oxide film 11c remain as side walls. These side walls reduce capacitive coupling between the bit lines 6 and the storage nodes 7 through the side wall portions. Subsequently, a thin silicon oxide film is deposited on the entire surface, and then only portions corresponding to the tunnel oxide film 5 shown in FIG. 3 are removed by means of wet etching. Furthermore, thermal oxidation is carried out to form a silicon oxide film serving as a second dielectric film (tunnel oxide film) 5. Furthermore, bit lines 6 are formed with polycrystalline silicon doped with n-type impurities in a layout pattern as shown in FIG. 3. At this point, the cross section taken along the line I—I' of FIG. 3 is shown in FIG. 12C. Then, a thick silicon oxide film 11d is deposited on the entire surface.

Figure 12D:
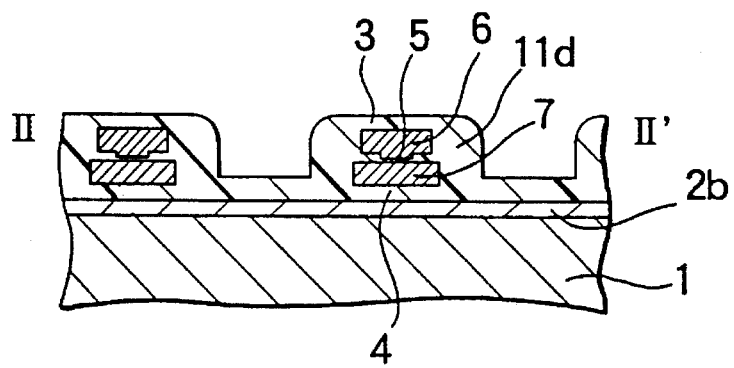

Then, anisotropic RIE (reactive ion etching) is performed on the entire surface to remove the silicon oxide film 11d. A thin silicon oxide film is then deposited on the entire surface to form a first dielectric film 3. At this point, the cross section taken along the line II—II' of FIG. 3 is shown in FIG. 12D. In FIG. 12D, the side walls of silicon oxide film 11b reduce capacitive coupling between the bit lines 6 and the first word lines 2a through the side wall portions. Then, a flat silicon oxide film is deposited on the entire surface, and second bit lines 6b are formed of aluminum in a layout pattern such as that shown in FIG. 3. Finally, a surface protection film 12 of silicon nitride is deposited. Thus, a memory cell array structure is complete.

Figure 13:
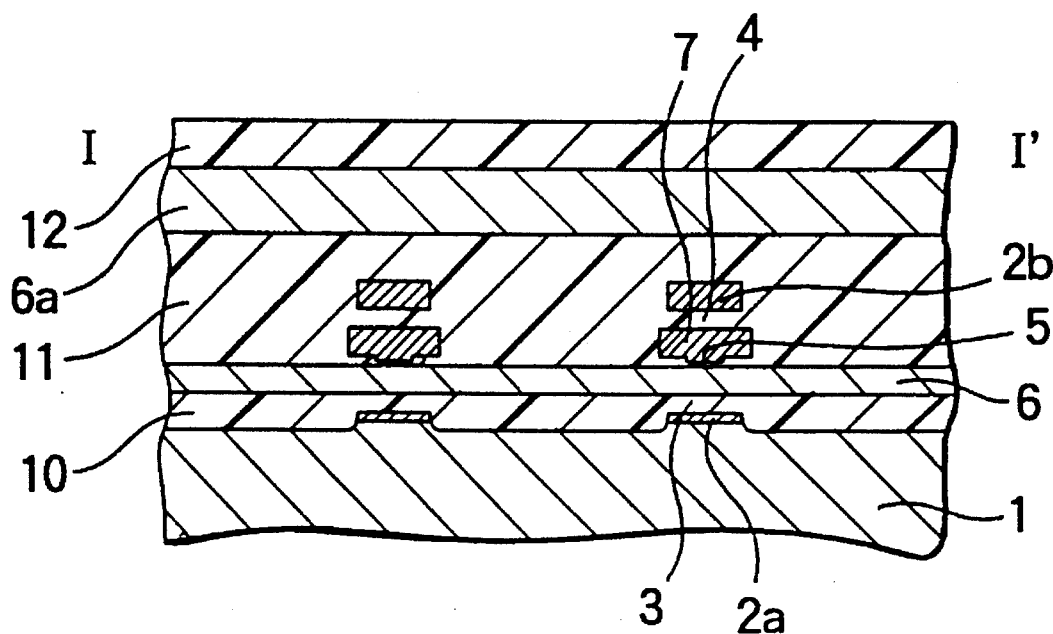
FIG. 13 is a cross-sectional view of still another embodiment of a memory cell array for use in a semiconductor memory according to the present invention.
Figure 14:
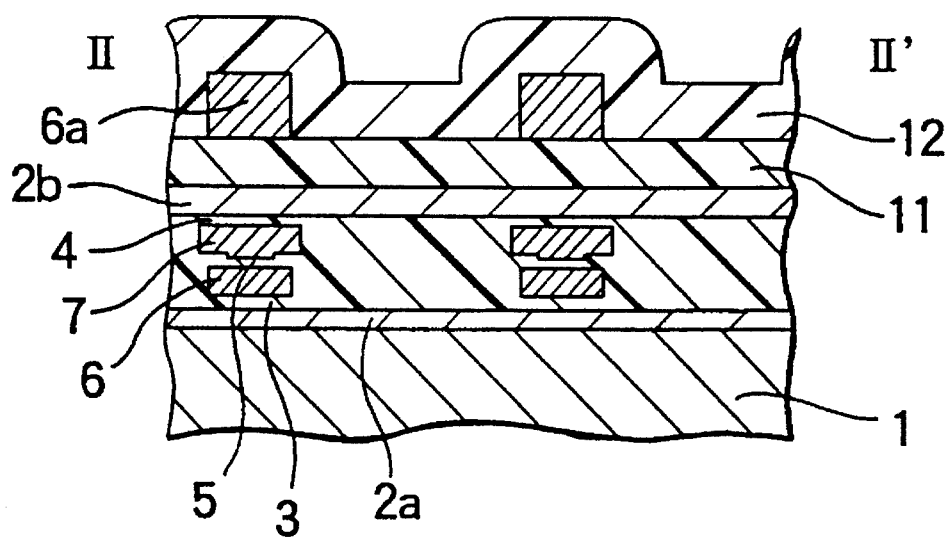
FIG. 14 is a cross-sectional view of an embodiment of the memory cell array for use in a semiconductor memory according to the present invention.

Still another embodiment of a memory cell array structure for use in a semiconductor memory according to the present invention will be described below. The plan view of this memory cell array structure is absolutely the same as that shown in FIG. 3. However, the memory cell array has a different cross-sectional structure from the previous embodiments. FIG. 13 is a cross-sectional view taken along the line I—I' of FIG. 3, and FIG. 14 is a cross-sectional view taken along the line II—II' of FIG. 3. The cross-sectional structure of this embodiment is basically the same as that shown in FIGS. 4 and 5 except that the bit lines 6 and the second word lines 2b are flattened into ideal forms. In this embodiment, the isolation oxide film 10 is formed not by selectively oxidizing the silicon substrate 1 using the so-called LOGOS (local oxidation of silicon) technique, but by embedding a silicon oxide film using the trench isolation technique so that the bit lines 6 may be flattened. In this embodiment, therefore, the first, second, and third dielectric films 3, 5, 4 forming memory cells do not have sharp edges such as those existing in the previous embodiment shown in FIG. 4, whereby higher reliability can be achieved. Furthermore, capacitive coupling between the second word lines 2b and the storage nodes 7 or the bit lines 6 can be reduced, thereby improving the operation margin.

In the present invention, as described above, a memory cell is constructed using no transistors. Storage of information is performed by storing or extracting a charge through a tunnel oxide film as a floating storage node which provides a function similar to that of a capacitor in conventional memory cell structures. The present invention provides a extremely simplified memory cell structure. Thus, according to the present invention, it is possible to reduce the number of production process steps and to improve the production yield. As a result, the present invention can provide a high-density, high performance, and low-cost semiconductor memory.

What is claimed is:

1. A semiconductor memory comprising a memory cell, said memory cell being free of transistors and comprising:

a laminated structure including a first word line, a first dielectric film having a first area and a first dielectric constant and disposed on said first word line, a bit line disposed on said first dielectric film, a second dielectric film having a second area and a second dielectric constant and disposed on said bit line, an information charge storage layer disposed on said second dielectric film, a third dielectric film having a third area and a third dielectric constant and disposed on said information charge storage layer, and a second word line disposed on said third dielectric film, wherein at least one of the second area and the second dielectric constant is smaller than the first area and the first dielectric constant, respectively, and the third area and the third dielectric constant, respectively.

2. A semiconductor memory comprising a memory cell, said memory cell being free of transistors and comprising:

a silicon substrate having a primary surface;

a first word line comprising a doped region in said silicon substrate at the primary surface of said silicon substrate;

a first silicon oxide film having a dielectric constant and an area and disposed on said first word line;

a bit line comprising polycrystalline silicon containing impurities disposed on said first silicon oxide film;

a tunnel oxide film having a dielectric constant and an area and disposed on said bit line;

an information charge storage layer comprising polycrystalline silicon containing impurities disposed on said tunnel oxide film;

a second silicon oxide film having a dielectric constant and an area and disposed on said information charge storage layer, at least one of the dielectric constant and the area of said tunnel oxide film being smaller than the dielectric constant and the area of said first silicon oxide film, respectively, and than the dielectric constant and the area of said second silicon oxide film, respectively; and a second word line comprising polycrystalline silicon containing impurities disposed on said second silicon oxide film.

3. A semiconductor memory comprising a memory cell, said memory cell being free of transistors and comprising:

a silicon substrate having a primary surface;

a second word line comprising a doped region in said silicon substrate at the primary surface of said silicon substrate;

a second silicon oxide film having a dielectric constant and an area and disposed on said second word line;

an information charge storage layer comprising polycrystalline silicon containing impurities disposed on said second silicon oxide film;

a tunnel oxide film having a dielectric constant and an area disposed on said information storage layer;

a bit line comprising polycrystalline silicon containing impurities disposed on said tunnel oxide film;

a first silicon oxide film having a dielectric constant and an area and disposed on said bit line, at least one of the dielectric constant and the area of said tunnel oxide film being smaller than the dielectric constant and the area of said first silicon oxide film and than the dielectric constant and the area of said second silicon oxide film; and a first word line comprising polycrystalline silicon containing impurities disposed on said first silicon oxide film.

4. The semiconductor memory according to claim 1 wherein said first and second word lines are arranged in an X-direction and said bit line is arranged in a Y-direction, a memory cell being disposed at every intersection between said bit line and said first and second word lines in a folded bit line scheme.

* * * * *